US012650482B2

(12) United States Patent
Zhao et al.

(10) Patent No.: US 12,650,482 B2
(45) Date of Patent: Jun. 9, 2026

(54) MAGNETIC FIELD ENHANCEMENT COMPONENT AND MAGNETIC FIELD ENHANCEMENT DEVICE

(71) Applicants:TSINGHUA UNIVERSITY, Beijing (CN); BEIJING TSINGHUA CHANGGUNG HOSPITAL, Beijing (CN)

(72) Inventors: Qian Zhao, Beijing (CN); Zhong-Hai Chi, Beijing (CN); Yong-Gang Meng, Beijing (CN); Zhuo-Zhao Zheng, Beijing (CN)

(73) Assignees: TSINGHUA UNIVERSITY, Beijing (CN); BEIJING TSINGHUA CHANGGUNG HOSPITAL, Beijing (CN)

( * ) Notice: Subject to any disclaimer, the term of this patent is extended or adjusted under 35 U.S.C. 154(b) by 365 days.

(21) Appl. No.: 18/276,651

(22) PCT Filed: Aug. 5, 2021

(86) PCT No.: PCT/CN2021/110742
§ 371 (c)(1),
(2) Date: Mar. 2, 2024

(87) PCT Pub. No.: WO2022/170741
PCT Pub. Date: Aug. 18, 2022

(65) Prior Publication Data
US 2024/0201291 A1      Jun. 20, 2024

(30) Foreign Application Priority Data

Feb. 10, 2021    (CN) ......................... 202110183921.6

(51) Int. Cl.
| | |
|---|---|
| *G01R 33/36* | (2006.01) |
| *G01R 33/34* | (2006.01) |
| *G01R 33/565* | (2006.01) |

(52) U.S. Cl.
CPC ... *G01R 33/3664* (2013.01); *G01R 33/34007* (2013.01); *G01R 33/5659* (2013.01)

(58) Field of Classification Search
CPC .......... G01R 33/3664; G01R 33/34007; G01R 33/5659; G01R 33/3642; G01R 33/38; G01R 33/28; G01R 33/36; G01R 33/422
See application file for complete search history.

(56) References Cited

U.S. PATENT DOCUMENTS

| | | |
|---|---|---|
| 9,823,319 B2 | 11/2017 | Yoo |
| 2012/0306497 A1 | 12/2012 | Kaneko |

(Continued)

FOREIGN PATENT DOCUMENTS

| | | |
|---|---|---|
| CN | 103328039 A | 9/2013 |
| CN | 103547937 A | 1/2014 |

(Continued)

OTHER PUBLICATIONS

Pan Guo-bing et al., "Design of solution for removing motor interference current", China Medical Equipment Apr. 2013 vol. 10 No.4, Apr. 15, 2013, (3 pages).

(Continued)

*Primary Examiner* — G. M. A Hyder

(57)      ABSTRACT

A magnetic field enhancing component and a magnetic field enhancing device. The magnetic field enhancing component includes a first dielectric layer, a first electrode layer, a second electrode layer, a third electrode layer, a fourth electrode layer, and a control circuit. The first electrode layer and the second electrode layer are arranged on a first surface of the first dielectric layer. The third electrode layer and the (Continued)

fourth electrode layer are arranged on a second surface of the first dielectric layer. The first electrode layer and the third electrode layer form a second structural capacitor. The second electrode layer and the fourth electrode layer form a third structural capacitor. The control circuit is connected between the first electrode layer and the second electrode layer, and includes a third capacitor, a first inductor, and a first switch circuit. The first inductor and the first switch circuit are connected in series, then is connected to the third capacitor in parallel. The first switch circuit is configured to be turned off in a radio frequency transmitting period.

19 Claims, 7 Drawing Sheets

(56)                    References Cited

U.S. PATENT DOCUMENTS

| | | | |
|---|---|---|---|
| 2020/0408861 A1 | 12/2020 | Park et al. | |
| 2024/0329171 A1* | 10/2024 | Zhao .................. | G01R 33/3628 |

FOREIGN PATENT DOCUMENTS

| | | |
|---|---|---|
| CN | 206930769 U | 1/2018 |
| CN | 108226834 A | 6/2018 |
| CN | 208061870 U | 11/2018 |
| CN | 109001656 A | 12/2018 |
| CN | 109490803 A | 3/2019 |
| CN | 110638453 A | 1/2020 |
| CN | 114910851 A | 8/2022 |

OTHER PUBLICATIONS

Chinese Decision to Grant a Patent (CN Application No. 2021101839216) , dated Jan. 2, 5 pages.

European Search Report (EP Application No. 21925394.5) , dated Jul. 16, 2024, 10 pages.

International Search Report of PCT/CN2021/110742.

* cited by examiner

MAGNETIC FIELD ENHANCEMENT COMPONENT AND MAGNETIC FIELD ENHANCEMENT DEVICE

CROSS-REFERENCE TO RELATED APPLICATION

The present application is a U.S. National Stage of International Application No. PCT/CN2021/110742, filed on Aug. 5, 2021, which claims priority to Chinese patent application No. 2021101839216, filed on Feb. 10, 2021, and entitled "Nonlinear Metasurface Device for Enhancement of MRI Based on Parallel Resonance", which is hereby incorporated by reference in its entirety.

TECHNICAL FIELD

This application relates to the field of detection technology, in particular to a magnetic field enhancing component and a magnetic field enhancing device applied to an MRI system.

BACKGROUND

A radio frequency (RF) coil of a traditional magnetic resonance imaging (MRI) system collects human body feedback signals by means of coil resonance. The strength of the human body feedback signals affects the quality of the signals collected by the RF coil, thus affecting a signal-to-noise ratio and a resolution of an image.

In the prior art, by providing metasurface devices, not only the magnetic field intensity in the receiving period of the RF signal increases, but also the magnetic field intensity in the RF transmitting period increases. The metasurface devices in the prior art all have linear metasurfaces, which cannot eliminate the influences of the metasurfaces in the RF transmitting period. An increase of the magnetic field intensity in the RF transmitting period will reduce the quality of the images detected by the MRI system.

SUMMARY

Based on this, for the purpose of improving the quality of images detected by the MRI system, it is necessary to provide a magnetic field enhancing component and a magnetic field enhancing device.

A magnetic field enhancing component includes a first dielectric layer, a first electrode layer, a second electrode layer, a third electrode layer, a fourth electrode layer, and a control circuit. The first dielectric layer includes a first surface and a second surface opposite to each other. The first electrode layer and the second electrode layer are arranged on the first surface at an interval. The third electrode layer and the fourth electrode layer are arranged on the second surface at an interval. An orthographic projection of the first electrode layer projected onto the first dielectric layer overlaps with an orthographic projection of the third electrode layer projected onto the first dielectric layer. The first electrode layer, the first dielectric layer, and the third electrode layer form a second structural capacitor. An orthographic projection of the second electrode layer projected onto the first dielectric layer overlaps with an orthographic projection of the fourth electrode layer projected onto the first dielectric layer. The second electrode layer, the first dielectric layer, and the fourth electrode layer form a third structural capacitor.

The control circuit includes a third capacitor, a first inductor, and a first switch circuit. One terminal of the third capacitor is connected to the first electrode layer, and another terminal of the third capacitor is connected to the second electrode layer. One terminal of the first inductor is connected to the second electrode layer. The first switch circuit is connected between another terminal of the first inductor and the first electrode layer. The first switch circuit is configured to be turned off in a radio frequency (RF) receiving period of the MRI system, and the first switch circuit is further configured to be turned on in an RF transmitting period of the MRI system, so that the control circuit is in a high impedance state.

The magnetic field enhancing component of the embodiment of the present application includes the first switch circuit in the magnetic field enhancing component. The first switch circuit is configured to be turned off in the RF receiving period. The second structural capacitor and the third structural capacitor are connected through the third capacitor. The first switch circuit and the first inductor are excluded from a conducting circuit, so that a loop, where the magnetic field enhancing component is located, resonates with a body part to be detected, thus increasing the magnetic field intensity of the detected signal. The first switch circuit is further configured to be turned on in the RF transmitting period of the MRI system. The third capacitor is connected in parallel with the first inductor, so that the control circuit is in the high impedance state. An open circuit is formed between the second structural capacitor and the third structural capacitor. In the RF transmitting period of the MRI system, there are few currents flowing between the second structural capacitor and the third structural capacitor, and the magnetic field generated by the loop, where the magnetic field enhancing component is located, is weakened, thereby reducing the influences of the loop, where the magnetic field enhancing component is located, on the magnetic field in the RF transmitting period of the MRI system, reducing artifacts in the images detected by the MRI system, and improving the clarity of the images detected by the MRI system.

BRIEF DESCRIPTION OF THE DRAWINGS

In order to illustrate the embodiments of the present application or the technical solutions in the prior art more clearly, the accompanying drawings needed for describing the embodiments or the prior art will be described briefly in the following description. Obviously, the drawings described herein are merely some embodiments of the present application. For those of ordinary skill in the art, other drawings may be obtained according to these drawings without creative efforts.

Figure 1:
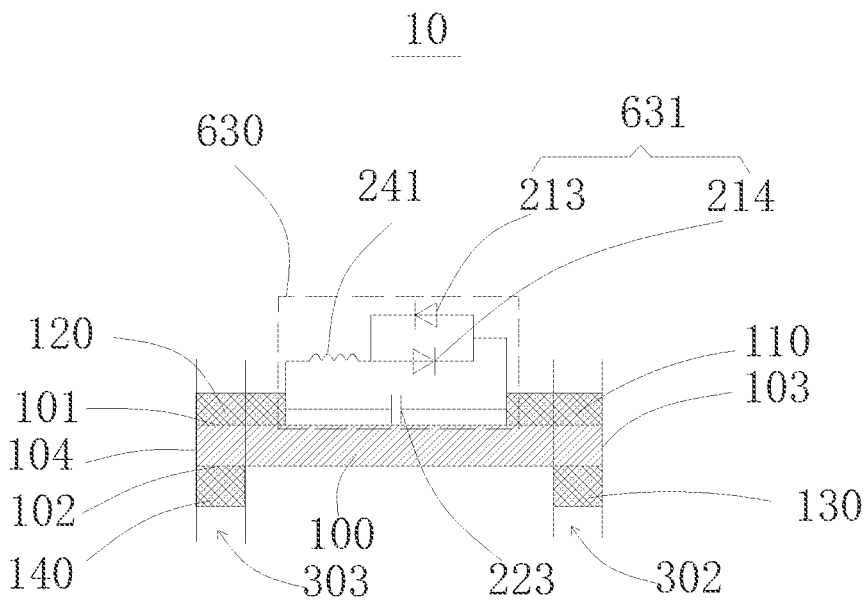
FIG. 1 is a sectional view of a first magnetic field enhancing component according to an embodiment of the present application.

REFERENCE NUMERALS first magnetic field enhancing component 10; second magnetic field enhancing component 30; third magnetic field enhancing component 40; first dielectric layer 100; first surface 101; second surface 102; first end 103; second end 104; first electrode layer 110; first sub-electrode layer 111; first connecting layer 190; second electrode layer 120; third electrode layer 130; fourth electrode layer 140; control circuit 630; third capacitor 223; first inductor 241; first switch circuit 631; first diode 213; second diode 214; first enhancement-mode MOSFET 235; second enhancement-mode MOSFET 236; fifth electrode layer 141; third inductor 243; second structural capacitor 302; third structural capacitor 303; fourth structural capacitor 304; fourth capacitor 224; through hole 106; first structural capacitor 150; first opening 411; second opening 412; third opening 413; fourth opening 414; magnetic field enhancing device 20; cylindrical supporting structure 50; first annular conductive sheet 510; second annular conductive sheet 520; third end 51; fourth end 53; fixing structure 930; first fixing member 931; second fixing member 932; control connecting opening 513; first connecting terminal 511; and second connecting terminal 512.

DETAILED DESCRIPTION OF THE
EMBODIMENTS

In order to make the objectives, features and advantages of the present application more obvious and to be better understood, the specific embodiments of the present application will be described in detail hereinafter in conjunction with the accompanying drawings. In the following description, numerous specific details are described to provide a thorough understanding of the present application. However, the present application may be implemented in many other manners different from those described herein, and those skilled in the art may make similar improvements without departing from the connotation of the present application, therefore the present application is not limited to the specific embodiments disclosed herein.

In the description of the present application, it should be understood that the terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", and other terms indicating orientations or positional relationships, are based on the orientations or positional relationships shown in the drawings, and are only used for the convenience of describing the present application and simplifying the description, rather than indicating or implying that the indicated devices or elements must have specific orientations, must be constructed and operated in certain orientations, thus these terms should not be construed as limitations on the present application.

In addition, the terms "first" and "second" are only used for descriptive purposes, and should not be understood as indicating or implying relative importance or implicitly specifying the quantity of the indicated technical features. Therefore, the features defined as "first" and "second" may explicitly or implicitly indicate that at least one of these features are included. In the description of the present application, "plurality" means at least two, such as two, three, etc., unless otherwise specifically defined.

In the present application, unless otherwise specified and limited, terms such as "install", "connect", "communicate", "fix" and so on, should be understood in a broad sense. For example, "connect" may define a fixed connection, or a detachable connection, or an integration, and it may define a mechanical connection, or an electrical connection, and it may define a direct connection, or an indirect connection through an intermediate member, and it may define an internal communication of two components, or an interaction relationship between two components, unless otherwise specified limitation. Those of ordinary skill in the art may understand the specific meanings of the above terms in the present application according to specific situations.

In the present application, unless otherwise clearly specified and limited, a first feature being "on" or "under" a second feature may mean that the first and second features are in a direct contact, or that the first and second features are in an indirect contact through an intermediate member. Moreover, the first feature being "above", "on", or "over" the second feature may mean that the first feature is directly above or obliquely above the second feature, or simply means that a level of the first feature is higher than that of the second feature. The first feature being "below", "under", or "down" the second feature may mean that the first feature is directly below or obliquely below the second feature, or simply means that the level of the first feature is lower than the second feature.

It should be noted that when an element is referred to as being "fixed on" or "arranged on" another element, the element may be directly on the other element or there may be an intermediate element. When one element is referred to as being "connected to" another element, the one element may be directly connected to the other element or there may be an intermediate element therebetween. The terms "vertical", "horizontal", "upper", "lower", "left", "right", and similar expressions herein are used for the purpose of description only but do not represent described is the only embodiment.

Referring to FIG. 1, an embodiment of the present application provides a first magnetic field enhancing component 10. The first magnetic field enhancing component 10 includes a first dielectric layer 100, a first electrode layer 110, a second electrode layer 120, a third electrode layer 130, a fourth electrode layer 140, and a control circuit 630.

The first dielectric layer 100 has a first end 103 and a second end 104 opposite to each other. The first dielectric layer 100 includes a first surface 101 and a second surface 102 opposite to each other. The first electrode layer 110 and the second electrode layer 120 are arranged on the first surface 101 at an interval. The third electrode layer 130 and the fourth electrode layer 140 are arranged on the second surface at an interval. The first electrode layer 110 and the third electrode layer 130 are disposed proximate to the first end 103, and the second electrode layer 120 and the fourth electrode layer 140 are disposed proximate to the second end 104. An orthographic projection of the first electrode layer 110 projected onto the first dielectric layer 100 overlaps with an orthographic projection of the third electrode layer 130 projected onto the first dielectric layer 100. The first electrode layer 110, the first dielectric layer 100, and the third electrode layer 130 form a second structural capacitor 302. An orthographic projection of the second electrode layer 120 projected onto the first dielectric layer 100 overlaps with an orthographic projection of the fourth electrode layer 140 projected onto the first dielectric layer 100. The second electrode layer 120, the first dielectric layer 100, and the fourth electrode layer 140 form a third structural capacitor 303.

In an embodiment, the control circuit 630 includes a third capacitor 223, a first inductor 241, and a first switch circuit 631. The third capacitor 223 is connected between the first electrode layer 110 and the second electrode layer 120. The first inductor 241 and the first switch circuit 631 are connected in series between the first electrode layer 110 and the second electrode layer 120. One terminal of the third capacitor 223 is connected to the first electrode layer 110, and another terminal of the third capacitor 223 is connected to the second electrode layer 120. One terminal of the first inductor 241 is connected to the second electrode layer 120. The first switch circuit 631 is connected between another terminal of the first inductor 241 and the first electrode layer 110. The first switch circuit 631 is configured to be turned off in an RF receiving period of the MRI system. The first switch circuit 631 is further configured to be turned on in an RF transmitting period of the MRI system, so that the control circuit 630 is in a high impedance state.

The first dielectric layer 100 may function as a support for the first electrode layer 110, the second electrode layer 120, the third electrode layer 130, and the fourth electrode layer 140. The first dielectric layer 100 may have a rectangular plate structure. The first dielectric layer 100 may also be made of insulating material. In an embodiment, the first dielectric layer 100 may be made of material of epoxy glass fiber.

In an embodiment, the first electrode layer 110, the second electrode layer 120, the third electrode layer 130, and the fourth electrode layer 140 may also have rectangular plate structures. In an embodiment, the first electrode layer 110, the second electrode layer 120, the third electrode layer 130, and the fourth electrode layer 140 may be made of conductive non-magnetic materials. In an embodiment, the first electrode layer 110, the second electrode layer 120, the third electrode layer 130 and the fourth electrode layer 140 may be made of one or more of metal materials such as gold, silver, and copper, etc.

In the first magnetic field enhancing component 10 provided in an embodiment of the present application, the first switch circuit 631 is configured to be turned off in the RF receiving period of the MRI system. The second structural capacitor 302 and the third structural capacitor 303 are connected through the third capacitor 223. When the first switch circuit 631 is turned off, the first switch circuit 631 and the first inductor 241 are excluded from a conducting circuit. A loop, where the first magnetic field enhancing component 10 is located, resonates with a body part to be detected, thus increasing the magnetic field intensity of the detected signal. The first switch circuit 631 is also configured to be turned on in the RF transmitting period of the MRI system. In the RF transmitting period, the first switch circuit 631 is turned on, and the third capacitor 223 is connected in parallel with the first inductor 241, so that the control circuit 630 is in the high impedance state. In the RF transmitting period, an open circuit is formed between the second structural capacitor 302 and the third structural capacitor 303. In the RF transmitting period of the MRI system, there are few currents flowing between the second structural capacitor 302 and the third structural capacitor 303. In the RF transmitting period of the MRI system, the magnetic field generated by the loop, where the first magnetic field enhancing component 10 is located, is weakened, thereby reducing the influences of the loop, where the first magnetic field enhancing component 10 is located, on the magnetic field in the RF transmitting period of the MRI system, reducing artifacts in the images detected by the MRI system, and improving the clarity of the images detected by the MRI system.

The first magnetic field enhancing component 10 is a nonlinear metasurface device for enhancement of MRI based on parallel resonance. The first switch circuit 631 may include a capacitor, an inductor and a switching device connected in parallel. The on/off of the first switch circuit 631 may allow the capacitor and the inductor to produce a parallel resonate in the RF transmitting period, and to be the high-impedance state. The influences of the loop, where the nonlinear metasurface device for enhancement of MRI based on parallel resonance is located, on the magnetic field in the RF transmitting period is reduced, thereby reducing the artifacts in the detected images, and improving the clarity of the detected images. The on/off of the first switch circuit 631 prevents the capacitor and the inductor from producing a parallel resonance in the RF receiving period. The loop, where the nonlinear metasurface device for enhancement of MRI based on parallel resonance is located, is configured to resonate with the body part to be detected in the RF receiving period to enhance the magnetic field intensity of the detected signal.

It may be understood that the first switch circuit 631 may be controlled by a control circuit. In an embodiment, the first switch circuit 631 includes a switch element and a control port. One terminal of the switch element is connected to the one terminal of the first inductor 241 away from the second electrode layer 120. Another terminal of the switch element is connected to the first electrode layer 110. The control port is connected to an external control device. The control port is configured for receiving a turning-on instruction and a turning-off instruction.

In the RF transmitting period of the MRI system, the control device outputs a turning-on instruction to the control port. When the control port receives the turning-on instruction, the first inductor 241 and the first electrode layer 110 conduct. The first inductor 241 is connected in parallel with the third capacitor 223 to generate a parallel resonance and go into the high impedance state. When the first switch circuit 631 is turned on, there are few currents flowing between the first electrode layer 110 and the second electrode layer 120.

In the RF receiving period of the MRI system, the control device outputs a turning-off instruction to the control port. When the control port receives the turning-off instruction, the first inductor 241 is disconnected from the first electrode layer 110. The first electrode layer 110, the third capacitor 223, and the second electrode layer 120 are connected in series to form a portion of a resonant circuit.

In an embodiment, the first switch circuit 631 may include a first diode 213 and a second diode 214. The positive terminal of the first diode 213 is connected to the first electrode layer 110, and the negative terminal of the first diode 213 is connected to the other terminal of the first inductor 241. The positive terminal of the second diode 214 is connected to the other terminal of the first inductor 241, and the negative terminal of the second diode 214 is connected to the first electrode layer 110.

The first magnetic field enhancing component 10 may be applied to the MRI system to enhance the magnetic field intensity of the human body feedback signal in the RF receiving period of the MRI system. The magnetic field energy in the RF transmitting period of the MRI system is more than 1000 times that in the receiving period. In the RF transmitting period of the MRI system, an induced voltage in the loop, where the first magnetic field enhancing component 10 is located in, is between tens of volts and hundreds of volts. In the RF receiving period of the MRI system, the induced voltage in the loop, where the first magnetic field enhancing component 10 is located, may be less than 1V. It may be understood that, in the RF receiving period of the MRI system, the induced voltage in the loop, where the first magnetic field enhancing component 10 is located, may also be less than 0.1V.

In the first switch circuit 631, the first diode 213 and the second diode 214 are connected in antiparallel. In the RF transmitting period of the MRI system, the RF coil of the MRI system transmits an RF transmission signal, and the magnetic field intensity of the RF transmission signal is comparatively large. The induced voltage generated in the loop, where the first magnetic field enhancing component 10 is located, is comparatively large. The positive and the negative of the voltage applied between two terminals of the first diode 213 and of the second diode 214 are alternated. The applied voltage exceeds forward voltages of the first diode 213 and the second diode 214, thus enabling the first diode 213 or the second diode 214 to conduct. The third capacitor 223 is connected in parallel with the first inductor 241, so that the control circuit 630 is in the high impedance state.

In the RF transmitting period of the MRI system, there are few currents flowing between the second structural capacitor 302 and the third structural capacitor 303, and the magnetic field generated in the loop, where the first magnetic field enhancing component 10 is located, is weakened, thereby reducing the influences of the loop, where the first magnetic field enhancing component 10 is located, on the magnetic field in the RF transmitting period, thereby reducing the artifacts in the images detected by the MRI system and improving the clarity of the images detected by the MRI system.

In the RF receiving period of the MRI system, the body part to be detected in the MRI system transmits a feedback signal, and the magnetic field intensity of the feedback signal is comparatively small. The induced voltage generated by the first magnetic field enhancing component 10 is comparatively small, and the applied voltage cannot reach the forward voltages of the first diode 213 and the second diode 214, therefore the first diode 213 and the second diode 214 do not conduct. The second structural capacitor 302 and the third structural capacitor 303 are connected through the third capacitor 223, and a magnetic field enhancing device composed of a plurality of first magnetic field enhancing components 10 is in a resonant state to enhance the magnetic field.

In an embodiment, the forward voltages of the first diode 213 and the second diode 214 are both between 0 and 1V. In an embodiment, the forward voltages of the first diode 213 and the second diode 214 may be the same. When the forward voltages of the first diode 213 and the second diode 214 are the same, the magnetic field enhancing device composed of the plurality of first magnetic field enhancing components 10 may continuously increase the magnetic field intensity in the RF receiving period of the MRI system, thereby improving the stability of the feedback signal. In an embodiment, the forward voltages of the first diode 213 and the second diode 214 are 0.8V.

In an embodiment, the first diode 213 and the second diode 214 are of the same type. Voltage drops across the conducting first diode 213 and across the conducting second diode 214 are the same, so that in the RF receiving period of the MRI system, the increases in magnetic field intensity of the magnetic field enhancing device composed of the plurality of first magnetic field enhancing components 10 are the same, thereby further improving the stability of the feedback signal.

Figure 2:
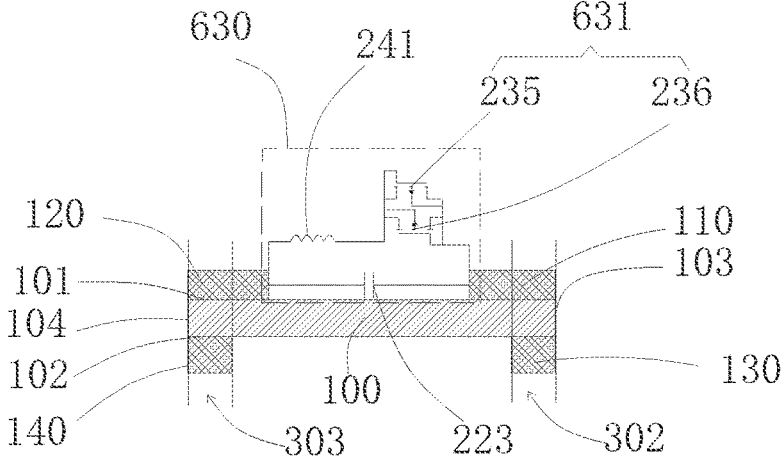
FIG. 2 is a schematic view showing a structure of the first magnetic field enhancing component according to an embodiment of the present application.

Referring to FIG. 2, in an embodiment, the first switch circuit 631 may include a first enhancement-mode MOSFET 235 and a second enhancement-mode MOSFET 236. The drain and the grid of the first enhancement-mode MOSFET 235 are connected to the one terminal of the first inductor 241 away from the second electrode layer 120, and the source of the first enhancement-mode MOSFET 235 is connected to the first electrode layer 110. The drain and the grid of the second enhancement-mode MOSFET 236 each are connected to the first electrode layer 110, and the source of the second enhancement-mode MOSFET 236 is connected to the one terminal of the first inductor 241 away from the second electrode layer 120.

The first enhancement-mode MOSFET 235 and the second enhancement-mode MOSFET 236 are connected in antiparallel. In the RF transmitting period of the MRI system, the RF coil of the MRI system transmits the RF transmission signal, and the magnetic field intensity of the RF transmission signal is comparatively large. The induced voltage generated in the loop, where the first magnetic field enhancing component 10 is located, is comparatively large. The positive and the negative of the voltage applied between two electrodes of the first enhancement-mode MOSFET 235 and between two electrodes of the second enhancement-mode MOSFET 236 are alternated. When the applied voltage exceeds a threshold voltage of the first enhancement-mode MOSFET 235 and a threshold voltage of the second enhancement-mode MOSFET 236, a conduction between the source and the drain of the first enhancement-mode MOSFET 235 and a conduction between the source and the drain of the second enhancement-mode MOSFET 236 are alternated. In the RF transmitting period of the MRI system, the third capacitor 223 is connected in parallel with the first inductor 241, so that the control circuit 630 is in the high impedance state.

In the RF transmitting period of the MRI system, there are few currents flowing between the second structural capacitor 302 and the third structural capacitor 303, and the magnetic field generated in the loop, where the first magnetic field enhancing component 10 is located, is weakened, thereby reducing the influence of the loop, where the first magnetic field enhancing component 10 is located, on the magnetic field in the RF transmitting period, thereby reducing the artifacts in the images detected by the MRI system and improving the clarity of the images detected by the MRI system.

In the RF receiving period of the MRI system, the body part to be detected in the MRI system transmits a feedback signal, and the magnetic field intensity of the feedback signal is relatively small. The induced voltage generated in the loop, where the first magnetic field enhancing component 10 is located, is comparatively small. The applied voltage cannot reach the threshold voltages of the first enhancement-mode MOSFET 235 and the threshold voltage of the second enhancement-mode MOSFET 236, the source and the drain of the first enhancement-mode MOSFET 235 conduct, and the source and the drain of the second enhancement-mode MOSFET 236 do not conduct. In the RF receiving period of the MRI system, the second structural capacitor 302 and the third structural capacitor 303 are connected through the third capacitor 223, and the magnetic field enhancing device composed of the plurality of magnetic field enhancing components 10 is in a resonant state and achieves the effects of enhancing the magnetic field.

In an embodiment, the first enhancement-mode MOSFET 235 and the second enhancement-mode MOSFET 236 have threshold voltages between 0 and 1V. The first enhancement-mode MOSFET 235 and the second enhancement-mode MOSFET 236 have the same threshold voltage. In the RF receiving period of the MRI system, the magnetic field enhancing device composed of the plurality of magnetic field enhancing components 10 may stably enhance the magnetic field, and the feedback signal may be outputted stably. In an embodiment, the first enhancement-mode MOSFET 235 and the second enhancement-mode MOSFET 236 each have a threshold voltage of 0.8V.

Figure 3:
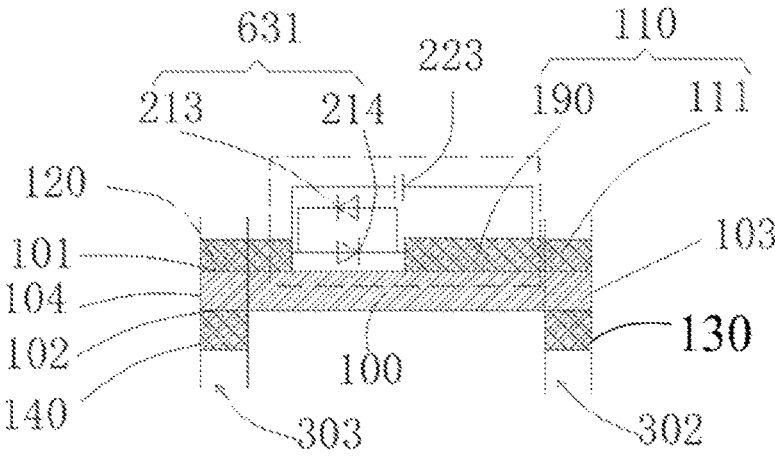
FIG. 3 is a schematic view showing a structure of the first magnetic field enhancing component according to another embodiment of the present application.

Referring to FIG. 3, in an embodiment, the first electrode layer 110 further includes a first sub-electrode layer 111 and a first connecting layer 190. The first sub-electrode layer 111 and the first connecting layer 190 are arranged on the first surface 101. The first sub-electrode layer 111 is connected to the first connecting layer 190. The first connecting layer 190 is disposed closer to the second electrode layer 120 than is the first sub-electrode layer 111. An orthographic projection of the first sub-electrode layer 111 projected onto the first dielectric layer 100 overlaps with an orthographic projection of the third electrode layer 130 projected onto the first dielectric layer 100. The one terminal of the third capacitor 223 is connected to one end of the first connecting layer 190 proximate to the first sub-electrode layer 111, and the other terminal of the third capacitor 223 is connected to the second electrode layer 120. The first switch circuit 631 is connected between another end of the first connecting layer 190 away from the first sub-electrode layer 111 and the second electrode layer 120.

In an embodiment, the first inductor 241 may be excluded from the first magnetic field enhancing component 10. The function of the first connecting layer 190 is the same as that of the first inductor 241 in the foregoing embodiments. It may be understood that the first connecting layer 190 functions as an inductor.

The first switch circuit 631 and the first connecting layer 190 are connected in series, then they are connected in parallel with the third capacitor 223. The control circuit 630 is connected in series between the first electrode layer 110 and the second electrode layer 120. The first sub-electrode layer 111 and the first connecting layer 190 may be formed by mean of spraying. The first sub-electrode layer 111 and the first connecting layer 190 are laid on the same layer, and the process is simple. In this embodiment, the first sub-electrode layer 111 is configured to form part of the structural capacitor. The first connecting layer 190 is configured to form a structural inductor, and no external inductor is needed, which can save costs.

Figure 4:
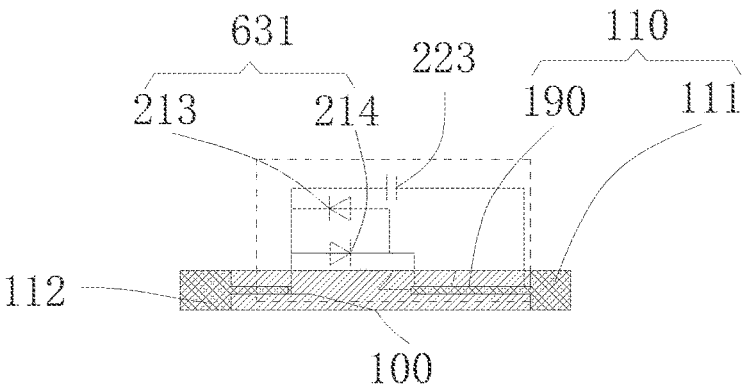
FIG. 4 is a top view of the first magnetic field enhancing component in FIG. 3.

Referring to FIG. 4, in an embodiment, a width of the first connecting layer 190 may be less than a width of the first sub-electrode layer 111. When in use, the magnetic field enhancing device composed of the first magnetic field enhancing components 10 covers the body part to be detected, and may enhance the magnetic field of the feedback signal of the body part to be detected by means of resonance. The width of the first connecting layer 190 in the first magnetic field enhancing component 10 is smaller than the width of the first sub-electrode layer 111, and the area of the body part to be detected covered by the first electrode layer 110 is reduced, and the shielding effect of the first electrode layer 110 is weakened, which may enhance the transmission capability of the feedback signal of the first magnetic field enhancing component 10, and makes it easier for the RF coil of the MRI system to receive feedback signals, thereby improving the quality of the received signals, and improving the quality of images formed by the processed signals. In addition, when the plurality of first magnetic field enhancing components 10 in FIG. 4 are used together, the oppositely overlapped region between the first connecting layers 190 in different first magnetic field enhancing components 10 is reduced. The stray capacitance formed between the air and the first connecting layer 190 in each of the different first magnetic field enhancing components 10 is reduced, and the coupling effect is reduced, thus the quality of the signals is improved.

In an embodiment, an electrical loss of the first connecting layer 190 accounts for less than half of an overall electrical loss of the magnetic field enhancing component 10. The electric loss of the first connecting layer 190 is comparatively small, thus the heat generation of the first magnetic field enhancing component 10 is comparatively small, and the effect of the magnetic field enhancing is better.

In an embodiment, the width of the first connecting layer 190 may be between one fifth and half of the width of the first sub-electrode layer 111. When the width of the first connecting layer 190 is between one fifth and half of the width of the first sub-electrode layer 111, the electrical loss of the first connecting layer 190 in the first magnetic field enhancing component 10 accounts for less than half of the overall electrical loss. When the width of the first connecting layer 190 is between one fifth and half of the width of the first sub-electrode layer 111, the electric loss of the first connecting layer 190 is comparatively small, and the heat generation of the first magnetic field enhancing component 10 is comparatively small. When the heat generation of the first magnetic field enhancing component 10 is comparatively small, the energy of the first magnetic field enhancing component 10 may be mainly used to generate a magnetic field, thus the effect of the magnetic field enhancing in the receiving period is better.

Figure 5:
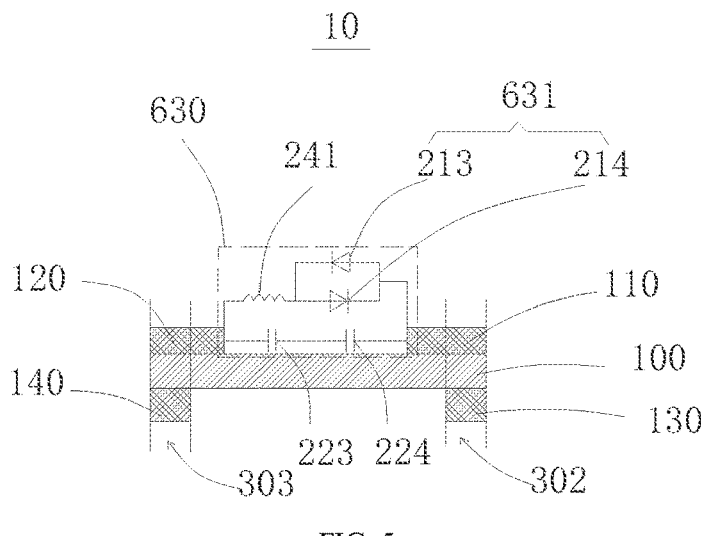
FIG. 5 is a schematic view showing a structure of the first magnetic field enhancing component according to another embodiment of the present application.

Referring to FIG. 5, compared with the embodiment in FIG. 1, in an embodiment, the control circuit 630 further includes a fourth capacitor 224. The fourth capacitor 224 is connected between the third capacitor 223 and the first electrode layer 110. The fourth capacitor 224 is connected in series with the third capacitor 223. The fourth capacitor 224 is configured to reduce a partial voltage of the third capacitor 223, thus improving the ability of the first magnetic field enhancing component 10 to resist a strong magnetic field, and reducing the probability of breakdown of the third capacitor 223.

In an embodiment, capacitance values of the second structural capacitor 302, the third structural capacitor 303, the third capacitor 223, and the fourth capacitor 224 are all equal. In the RF receiving period of the MRI system, the second structural capacitor 302, the third structural capacitor 303, the third capacitor 223, and the fourth capacitor 224 have the same partial pressure, thereby improving the uniformity of the magnetic field, weakening a distortion caused by the inconsistency of the magnetic field enhancement, and improving the quality of the images.

Figure 6:
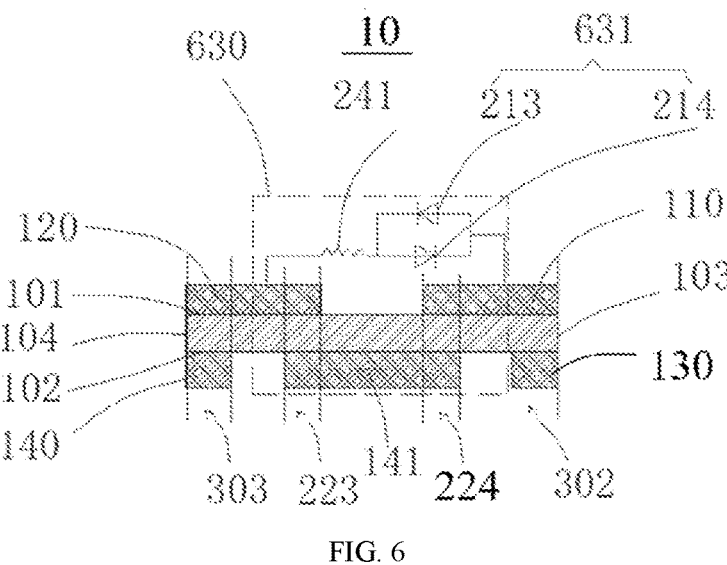
FIG. 6 is a schematic view showing a structure of the first magnetic field enhancing component according to another embodiment of the present application.

Referring to FIG. 6, compared with the embodiment shown in FIG. 5, in an embodiment, the third capacitor 223 and the fourth capacitor 224 may be excluded from the first magnetic field enhancing component 10. In an embodiment of FIG. 6, the first magnetic field enhancing component 10 further includes a fifth electrode layer 141. The fifth electrode layer 141 is arranged on the second surface 102. The fifth electrode layer 141 is arranged between the third electrode layer 130 and the fourth electrode layer 140 at intervals. An orthographic projection of the fifth electrode layer 141 projected onto the first dielectric layer 100 overlaps with the orthographic projection of the first electrode layer 110 projected onto the first dielectric layer 100. The fifth electrode layer 141, the first dielectric layer 100, and the first electrode layer 110 form the fourth capacitor 224 shown in FIG. 5. The orthographic projection of the fifth electrode layer 141 projected onto the first dielectric layer 100 overlaps with the orthographic projection of the second electrode layer 120 projected onto the first dielectric layer 100. The fifth electrode layer 141, the first dielectric layer 100, and the second electrode layer 120 form the third capacitor 223 shown in FIG. 5.

In the embodiment shown in FIG. 6, the third capacitor 223 and the fourth capacitor 224 are shown. Other non-capacitive structural portions of the first electrode layer 110 and of the second electrode layer 120 are used for conducting electricity. The first switch circuit 631 and the first inductor 241 are connected in series to form a first circuit. A portion of the fifth electrode layer 141 and a portion of the second electrode layer 120, which are opposite to each other, are connected in series with the fourth capacitor 224 to form a second circuit. The first circuit and the second circuit are connected in parallel to form the control circuit 630. In the control circuit 630, the laid electrodes form capacitors, thus no external capacitors are needed, thereby saving costs.

Figure 7:
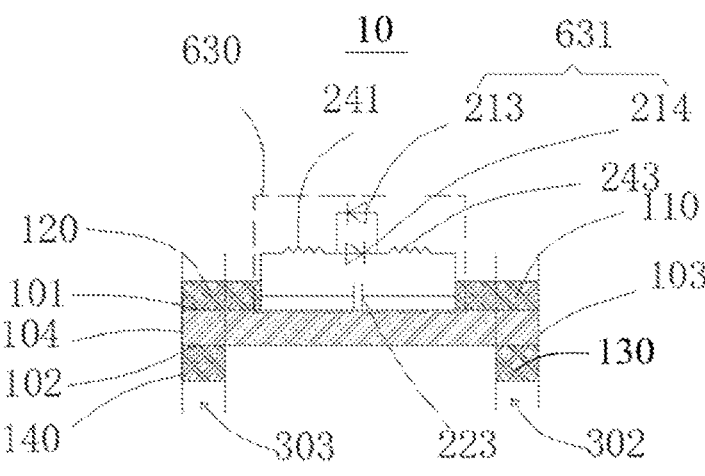
FIG. 7 is a schematic view showing a structure of the first magnetic field enhancing component according to another embodiment of the present application.

Referring to FIG. 7, compared with the embodiment of FIG. 1, in an embodiment, the control circuit 630 further includes a third inductor 243. The first inductor 241, the first switch circuit 631, and the third inductor 243 are connected in series. One terminal of the third inductor 243 is connected to the first electrode layer 110, and another terminal of the third inductor 243 is connected to the first switch circuit 631. The first inductor 241 and the third inductor 243 are connected to two terminals of the first switch circuit 631 respectively, thereby increasing the symmetry of the structure of the first magnetic field enhancing component 10, increasing the symmetry of the magnetic field of the magnetic field enhancing component 10, and weakening the distortion caused by the inconsistency of the magnetic field enhancement.

Figure 8:
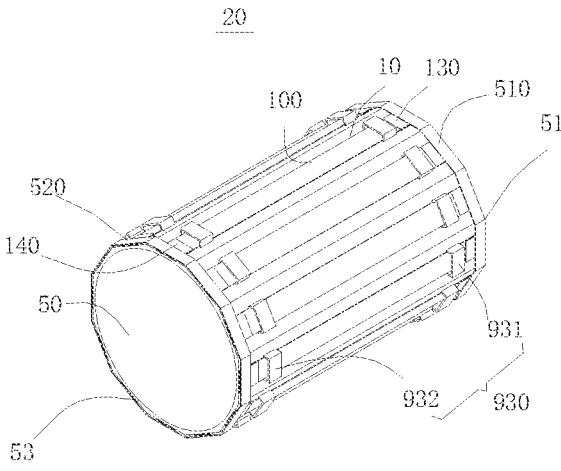
FIG. 8 is a schematic view showing a structure of a first magnetic field enhancing device according to an embodiment of the present application.
Figure 9:
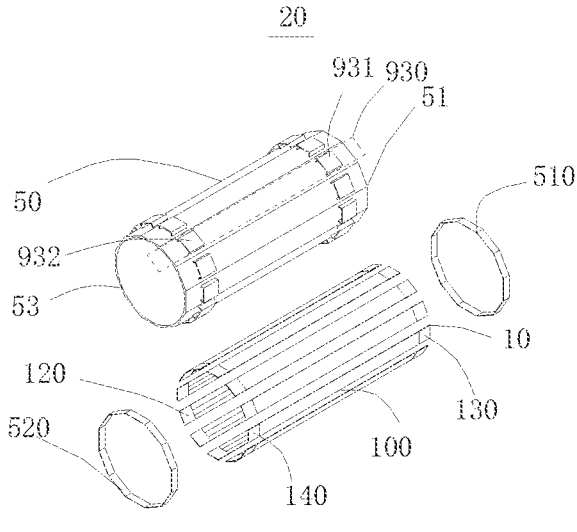
FIG. 9 is an exploded structural view of the first magnetic field enhancing device in FIG. 8.

Referring to FIG. 8 and FIG. 9 together, an embodiment of the present application provides a magnetic field enhancing device 20. The magnetic field enhancing device 20 includes a cylindrical supporting structure 50, a plurality of first magnetic field enhancing components 10, a first annular conductive sheet 510, and a second annular conductive sheet 520.

The cylindrical supporting structure 50 has two opposite and spaced ends: a third end 51 and a fourth end 53. The cylindrical supporting structure 50 encloses to form a detecting space. The plurality of first magnetic field enhancing components 10 are arranged on the cylindrical supporting structure 50 at intervals. Each of the first magnetic field enhancing components 10 is configured to extend from the third end 51 to the fourth end 53. The first magnetic field enhancing component 10 may be the first magnetic field enhancing component 10 described in any one of the embodiments of FIG. 1 to FIG. 7.

In the magnetic field enhancing device 20, the first electrode layer 110 and the third electrode layer 130 are disposed proximate to the third end 51. The second electrode layer 120 and the fourth electrode layer 140 are disposed proximate to the fourth end 53. The first annular conductive sheet 510 is arranged on the cylindrical supporting structure 50 and proximate to the third end 51. The first annular conductive sheet 510 is electrically connected to the third electrode layers 130 of the plurality of first magnetic field enhancing components 10. The second annular conductive sheet 520 is arranged on the cylindrical supporting structure 50 and proximate to the fourth end 53. The second annular conductive sheet 520 is electrically connected to the fourth electrode layers 140 of the plurality of first magnetic field enhancing components 10.

Figure 10:
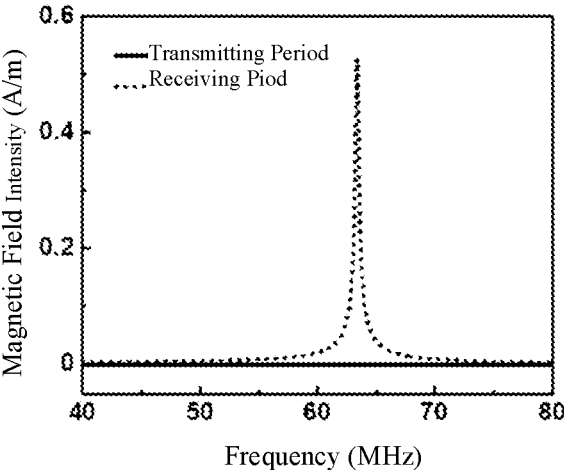
FIG. 10 is a view showing magnetic field intensities of the first magnetic field enhancing device in FIG. 8 and FIG. 9.

The magnetic field enhancing device 20 of an embodiment of the present application includes a plurality of first magnetic field enhancing components 10. The first connecting layers 190 of all first magnetic field enhancing components 10 are connected in parallel by the second annular conductive sheet 520 to form an LC oscillator circuit. Referring to FIG. 10, a resonant frequency of the magnetic field enhancing device 20 is equal to a target resonant frequency, thus enhancing the feedback signals of the body part to be detected.

The magnetic field enhancing device 20 of the embodiment of the present application includes the plurality of first magnetic field enhancing components 10. In the first magnetic field enhancing component 10, the first switch circuit 631 is configured to be turned off in the RF receiving period of the MRI system. The second structural capacitor 302 and the third structural capacitor 303 are connected by the third capacitor 223, and the first switch circuit 631 and the first inductor 241 are excluded from a conducting circuit. The first switch circuit 631 is further configured to conduct in the RF transmitting period of the MRI system. The third capacitor 223 and the first inductor 241 are connected in parallel, to produce a parallel resonance, so that the control circuit 630 is in the high impedance state. The second structural capacitor 302 is disconnected from the third structural capacitor 303. The frequency of the magnetic field enhancing device 20 is the same as the frequency at which the body part to be detected transmits the feedback signal, and the magnetic field enhancing device 20 produces a resonance, thereby enhancing the magnetic field intensity of the feedback signals. In the RF transmitting period of the MRI system, there are few currents flowing between the second structural capacitor 302 and the third structural capacitor 303, and the magnetic field generated by the magnetic field enhancing device 20 is weakened, thereby reducing the influences of the magnetic field enhancing device 20 on the magnetic field in the RF transmitting period of the MRI system, reducing the artifacts in the images detected by the MRI system, and improving the clarity of the images detected by the MRI system.

In addition, the plurality of first magnetic field enhancing components 10 may be distributed on the cylindrical supporting structure 50 in a circular array. The structure of the cylindrical supporting structure 50 is symmetrical, and the magnetic field is evenly distributed, thus having consistent enhancement effects on the feedback signals. In addition, when in use, the magnetic field enhancing device 20 may cover an arm, a leg, or a hand of the human body, and is disposed at a position close to the body part to be detected, so as to improve the detection sensitivity.

It may be understood that the cylindrical supporting structure 50 may also be replaced with a planar supporting structure or a curved supporting structure. The first annular conductive sheet 510 and the second annular conductive sheet 520 may be replaced with straight conductive sheets or curved conductive sheets in accordance with the planar support structure or the curved support structure, respectively.

Referring to FIG. 8, in an embodiment, the magnetic field enhancing device 20 may further include a plurality of fixing structures 930. The plurality of fixing structures 930 are arranged on an outer surface of the cylindrical supporting structure 50 and distributed in a circular array. The plurality of fixing structures 930 are configured to fix the first magnetic field enhancing components 10 one by one. The first magnetic field enhancing component 10 may be fixed on the cylindrical supporting structure 50 by means of the fixing structure 930.

The fixing structure 930 may be a strap or a buckle. The first magnetic field enhancing component 10 may be detachably attached to the cylindrical supporting structure 50 by means of the fixing structure 930.

In an embodiment, the fixing structure 930 includes the first fixing member 931 and the second fixing member 932 spaced apart. The first fixing member 931 and the second fixing member 932 are configured to fix two ends of the first magnetic field enhancing component 10 respectively. The first fixing member 931 is disposed proximate to the third end 51. The second fixing member 932 is disposed proximate to the fourth end 53. The first fixing member 931 is configured to fix one end of the magnetic field enhancing component 10, and the second fixing member 932 is configured to fix another end of the first magnetic field enhancing component 10.

In an embodiment, the first fixing member 931 and the second fixing member 932 include U-shaped buckles. The first fixing member 931 and the second fixing member 932 may be buckled on the outer surface of the cylindrical supporting structure 50. Openings of U-shaped spaces of the first fixing member 931 and the second fixing member 932 face the third end 51 and the fourth end 53, respectively. The U-shaped spaces of the first fixing member 931 and the second fixing member 932 are configured for the insertion of the first magnetic field enhancing component 10. If the first magnetic field enhancing component 10 needs to be replaced, the first magnetic field enhancing component 10 needs only to be removed from or inserted into the U-shaped spaces of the first fixing member 931 and the second fixing member 932.

Figure 11:
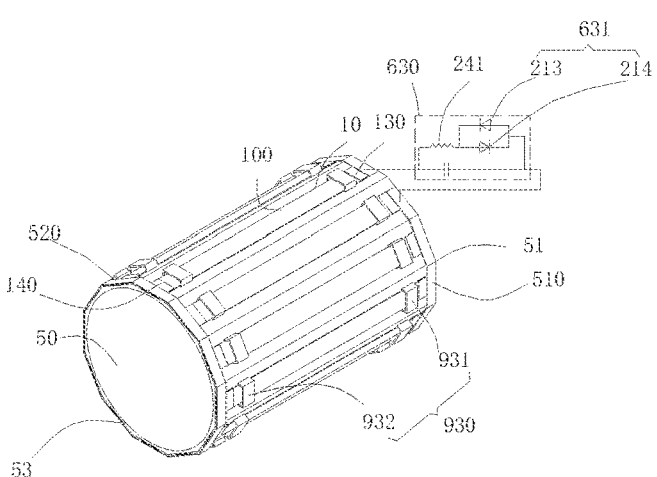
FIG. 11 is a schematic view showing a structure of the first magnetic field enhancing device according to another embodiment of the present application.
Figure 12:
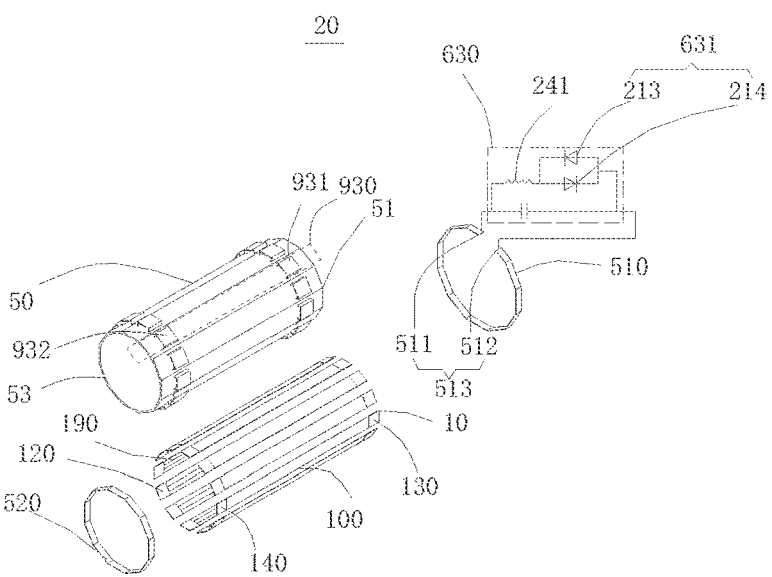
FIG. 12 is an exploded structural view of the first magnetic field enhancing device in FIG. 11.

Referring to FIG. 11 and FIG. 12, in an embodiment, the first annular conductive sheet 510 may also include a control connecting opening 513. The control connecting opening 513 is an opening of the first annular conductive sheet 510. The control connecting opening 513 includes a first connecting terminal 511 and a second connecting terminal 512. The first connecting terminal 511 and the second connecting terminal 512 are spaced apart. The first connecting terminal 511 and the second connecting terminal 512 are connected to third electrode layers 130 of two adjacent first magnetic field enhancing components 10, respectively. The control circuit 630 is connected between the first connecting terminal 511 and the second connecting terminal 512. It may be understood that the one terminal of the third capacitor 223 is connected to the first connecting terminal 511, and the other terminal of the third capacitor 223 is connected to the second connecting terminal 512. The one terminal of the first inductor 241 is connected to the first connecting terminal 511. The first switch circuit 631 is connected between the other terminal of the first inductor 241 and the second connecting terminal 512. The first switch circuit 631 is configured to be turned off in the RF receiving period of the MRI system. The first switch circuit 631 is also configured to be turned on in the RF transmitting period of the MRI system, so that the control circuit 630 is in the high impedance state.

In the RF receiving period of the MRI system, the first switch circuit 631 is turned off. The first connecting terminal 511 and the second connecting terminal 512 are connected by the third capacitor 223. The first switch circuit 631 and the first inductor 241 are excluded from the conducting circuit. The frequency of the magnetic field enhancing device 20 is the same as the frequency at which the body part to be detected transmits the feedback signal, and the magnetic field enhancing device 20 produces a resonance, thereby enhancing the magnetic field intensity of the feedback signals.

In the RF transmitting period of the MRI system, the first switch circuit 631 is turned on, and the third capacitor 223 and the first inductor 241 are connected in parallel, so that the control circuit 630 is in the high impedance state. The first connecting terminal 511 is disconnected from the second connecting terminal 512. The connection relationship between components in the magnetic field enhancing device 20 is changed, and the resonant frequency is changed. The resonant frequency of the magnetic field enhancing device 20 is not equal to the target frequency, and the magnetic field enhancing device 20 does not have the effect of enhancing the magnetic field, thereby reducing artifacts in the detected images and improving the clarity of the detected image.

In an embodiment, the first annular conductive sheet 510 further includes a plurality of the control connecting openings 513 and a plurality of the control circuits 630 arranged at intervals. Two terminals of each control connecting opening 513 are connected to third electrode layers 130 of two adjacent magnetic field enhancing components 10, respectively. Each control connecting opening 513 is connected to a control circuit 630 to cut off a current between two adjacent first magnetic field enhancing components 10 in the transmitting period, thereby reducing the influences of a loop current flowing through the two adjacent first magnetic field enhancing components 10 in the transmitting period.

Figure 13:
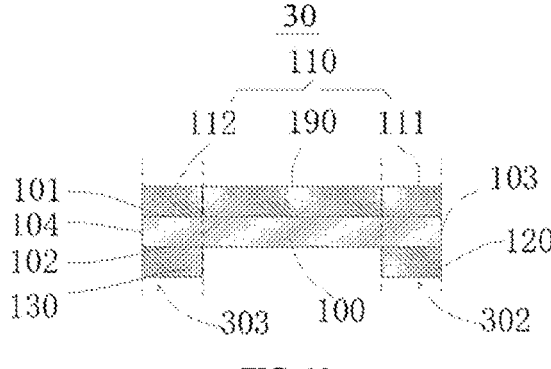
FIG. 13 is a side view showing a second magnetic field enhancing component according to an embodiment of the present application.
Figure 14:
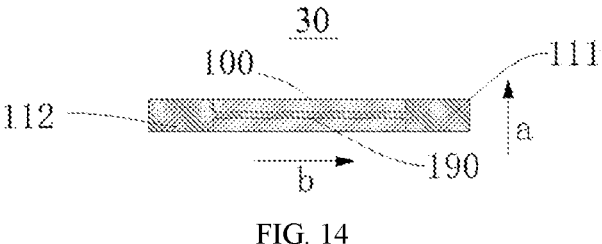
FIG. 14 is a top view of the second magnetic field enhancing component in FIG. 13.

Referring to FIG. 13 and FIG. 14, in an embodiment, a second magnetic field enhancing component 30 is further provided and includes a first dielectric layer 100, a first electrode layer 110, a second electrode layer 120, and a third electrode layer 130. In the embodiment of FIG. 13, the first electrode layer 110 is arranged on the entire first surface 101. Compared with the embodiment in FIG. 1, the second magnetic field enhancing component 30 of the embodiment in FIG. 13 includes the second electrode layer 120 and the third electrode layer 130 arranged on the second surface 102 at an interval.

The first electrode layer 110 is arranged on the first surface 101, and is configured to extend from the first end 103 towards the second end 104. The first electrode layer 110 includes a first sub-electrode layer 111, a second sub-electrode layer 112, and a first connecting layer 190. The first sub-electrode layer 111 and the second sub-electrode layer 112 have the same width and are arranged opposite to each other at an interval. One end of the first connecting layer 190 is connected to the first sub-electrode layer 111, and another end of the first connecting layer 190 is connected to the second sub-electrode layer 112. A width of the first connecting layer 190 is less than the width of the first sub-electrode layer 111 or the width of the second sub-electrode layer 112.

The second electrode layer 120 and the third electrode layer 130 are arranged on the second surface 102 opposite to each other and spaced at an interval. The second electrode layer 120 is arranged proximate to the first terminal 103. The third electrode layer 130 is arranged proximate to the second terminal 104. An orthographic projection of the second electrode layer 120 projected onto the first dielectric layer 100 overlaps with an orthographic projection of the first sub-electrode layer 111 projected onto the first dielectric layer 100. The second electrode layer 120, the first dielectric layer 100, and the first sub-electrode layer 111 form a second structural capacitor 302. An orthographic projection of the third electrode layer 130 projected onto the first dielectric layer 100 overlaps with an orthographic projection of the second sub-electrode layer 112 projected onto the first dielectric layer 100. The third electrode layer 130, the first dielectric layer 100, and the second sub-electrode layer 112 form a third structural capacitor 303.

The first dielectric layer 100 may function as a support for the first electrode layer 110, the second electrode layer 120, and the third electrode layer 130. The first dielectric layer 100 may be made of insulating material. The first dielectric layer 100 may be a rectangular plate structure. The first dielectric layer 100 may be made of insulating material. In an embodiment, the first dielectric layer 100 may be made of material of epoxy glass fiber. The first electrode layer 110, the second electrode layer 120, and the third electrode layer 130 may be made of conductive and non-magnetic materials. In an embodiment, the first electrode layer 110, the second electrode layer 120, and the third electrode layer 130 may be made of one or more of metal materials such as gold, silver, and copper, etc.

The first magnetic field enhancing component 10 in FIGS. 8-9 and 11-12 may be replaced with the second magnetic field enhancing component 30. When the second magnetic field enhancing component 30 is applied to the magnetic field enhancing device 20, the first annular conductive sheet 510 is connected to the second electrode layers 120 of a plurality of the second magnetic field enhancing components 30, respectively, and the second annular conductive sheet 520 is connected to the third electrode layers 130 of the plurality of the second magnetic field enhancing components 30, respectively The second structural capacitor 302 and the third structural capacitor 303 in the second magnetic field enhancing component 30 are connected through the first connecting layer 190 to form a resonant circuit. The second magnetic field enhancing component 30 covers the body part to be detected, and enhances the magnetic field of the feedback signal of the body part to be detected by means of resonance. A width of the first connecting layer 190 in the second magnetic field enhancing component 30 may be less than a width of the first sub-electrode layer 111. The region of the body part to be detected covered by the first electrode layer 110 is reduced, the shielding effect of the first electrode layer 110 is weakened, and the transmission capability of the feedback signal is enhanced, thereby making it easier for the RF coil of the MRI system to receive the feedback signals, improving the quality of the received signals, and improving the quality of images formed by the processed signals.

In addition, a plurality of second magnetic field enhancing components 30 may be arranged in a row array, and the stray capacitance formed between the air, a detecting cylinder, and the first connecting layer 190 in each of the plurality of second magnetic field enhancing components 30 is reduced, thus reducing the coupling effect, and improving the quality of the signals.

In an embodiment, an electrical loss of the first connecting layer 190 accounts for less than half of an overall electrical loss of the second magnetic field enhancing component 30. The electric loss of the first connecting layer 190 is comparatively small, and the heat generation of the second magnetic field enhancing component 30 is comparatively small. The energy of the second magnetic field enhancing component 30 is mainly used to generate a magnetic field, and the effect of the magnetic field enhancing is better in the receiving period.

In an embodiment, the width of the first connecting layer 190 may be between one fifth and half of the width of the first sub-electrode layer 111. When the width of the first connecting layer 190 is between one fifth and half of the width of the first sub-electrode layer 111, the electrical loss of the first connecting layer 190 in the second magnetic field enhancing component 30 accounts for less than half of the overall electrical loss. The electric loss of the first connecting layer 190 is comparatively small, and the heat generation of the second magnetic field enhancing component 30 is comparatively small. The energy of the second magnetic field enhancing component 30 may be mainly used to generate a magnetic field, and the effect of the magnetic field enhancing in the receiving period is better.

In an embodiment, the first sub-electrode layer 111 and the second sub-electrode layer 112 have widths ranging from 1 mm to 30 mm. The width of the first connecting layer 190 ranges from 1 mm to 15 mm. In an embodiment, the width of the first sub-electrode layer 111 and the width of the second sub-electrode layer 112 are 15 mm, and the width of the first connecting layer 190 is 4 mm.

Figure 15:
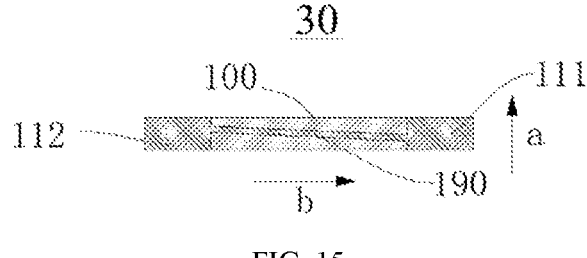
FIG. 15 is a schematic view showing a structure of the second magnetic field enhancing device according to an embodiment of the present application.

Referring to FIG. 15, in an embodiment, an angle between an extension direction of the first connecting layer 190 and a first direction b is an acute angle or an obtuse angle. The first direction b is from the first end 103 to the second end 104. When the plurality of second magnetic field enhancing components 30 in FIG. 15 are applied to the magnetic field enhancing device 20, the first annular conductive sheet and the second annular conductive sheet are arranged on the magnetic field enhancing device 20, and the first connecting layers 190 in each two opposite second magnetic field enhancing components 30 are arranged to be staggered, thus parallel overlapped portions of the plurality of the first connecting layers 190 are reduced. The stray capacitance formed between the air and the first connecting layers 190 in each two opposite second magnetic field enhancing components 30 is reduced, thereby reducing the coupling effect, and improving the quality of the signals.

Figure 16:
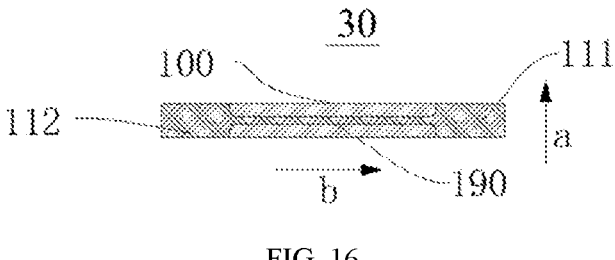
FIG. 16 is a schematic view showing a structure of the second magnetic field enhancing device according to another embodiment of the present application.

Referring to FIG. 16, in an embodiment, an arc chamfer is formed at a position, where a sidewall of the first connecting layer 190 in the second magnetic field enhancing component 30 intersects with a side wall of the first sub-electrode layer 111 or a sidewall of the second sub-electrode 112. The width of the first connecting layer 190 is less than the width of the first sub-electrode layer 111. A current flows in the first sub-electrode layer 111, the first connecting layer 190, and the second sub-electrode layer 112. The current gathers at a joint of the first sub-electrode layer 111 and the first connecting layer 190, and the current density increases. The arc chamfer formed at the position, where the sidewall of the first connecting layer 190 intersects with the side wall of the first sub-electrode layer 111, so that the first connecting layer 190 and the first sub-electrode layer 111 are connected by means of a horn-shaped structure, thereby slowing down a sudden change of a current density, reducing the current density at the position where the sidewall of the first connecting layer 190 intersects with the side wall of the first sub-electrode layer 111. The current density at the joint of the first sub-electrode layer 111 and the first connecting layer 190 is reduced, thus the heat generation is reduced, and the second magnetic field enhancing component 20 may have a higher service life.

The current gathers at the joint of the second sub-electrode layer 112 and the first connecting layer 190, and the current density increases. The arc chamfer is formed at the position, where the sidewall of the first connecting layer 190 intersects with the side wall of the second sub-electrode layer 112, so that the horn-shaped structure is formed at the joint of the first connecting layer 190 and the second sub-electrode layer 112. The horn-shaped structure formed at the joint of the first connecting layer 190 and the second sub-electrode layer 112 may slow down the sudden change of the current density, thereby reducing the current density at the position where the sidewall of the first connecting layer 190 intersects with the side wall of the second sub-electrode layer 112. The current density at the joint of the second sub-electrode layer 112 and the first connecting layer 190 is reduced, thus the heat generation is reduced, and the second magnetic field enhancing component 20 may have a higher service life.

Figure 17:
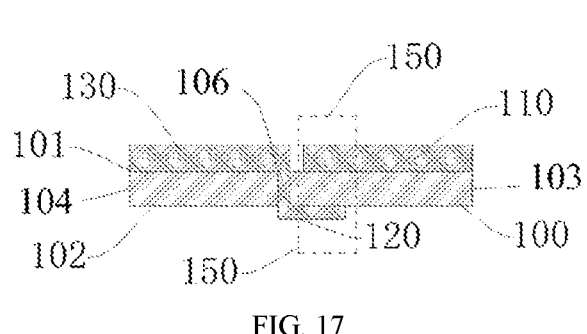
FIG. 17 is a side view of a third magnetic field enhancing component according to an embodiment of the present application.
Figure 18:
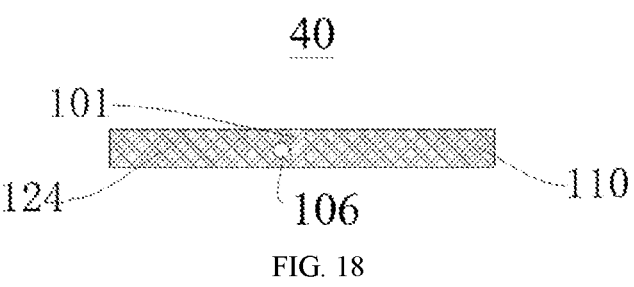
FIG. 18 is a top view of the third magnetic field enhancing component in FIG. 17.

Referring to FIG. 17 and FIG. 18, in an embodiment, the present application further provides a third magnetic field enhancing component 40. The third magnetic field enhancing component 40 includes a first electrode layer 110, a second electrode layer 120, a third electrode layer 130, and a first dielectric layer 100.

The first dielectric layer 100 has a first end 103 and a second end 104 opposite to each other. The first dielectric layer 100 includes a first surface 101 and a second surface 102 arranged opposite to each other. The first electrode layer 110 and the third electrode layer 130 are arranged on the first surface 101 at an interval. The second electrode layer 120 is arranged on the second surface 102. A through hole 106 is formed in the first dielectric layer 100. Conductive material is provided in the through hole 106. The third electrode layer 130 is electrically connected to the second electrode layer 120 through the conductive material. An orthographic projection of the first electrode layer 110 projected onto the first dielectric layer 100 overlaps with an orthographic projection of the second electrode layer 120 projected onto the first dielectric layer 100. The first electrode layer 110, the first dielectric layer 100, and the second electrode layer 120 form the first structural capacitor 150.

A portion of the first electrode layer 110 and a portion of the third electrode layer 130, which do not overlap with the second electrode layer 120, form structural inductors. The first electrode layer 110, the third electrode layer 130, and the first structural capacitor 150 in the third magnetic field enhancing component 40 form an LC oscillator circuit.

Figure 19:
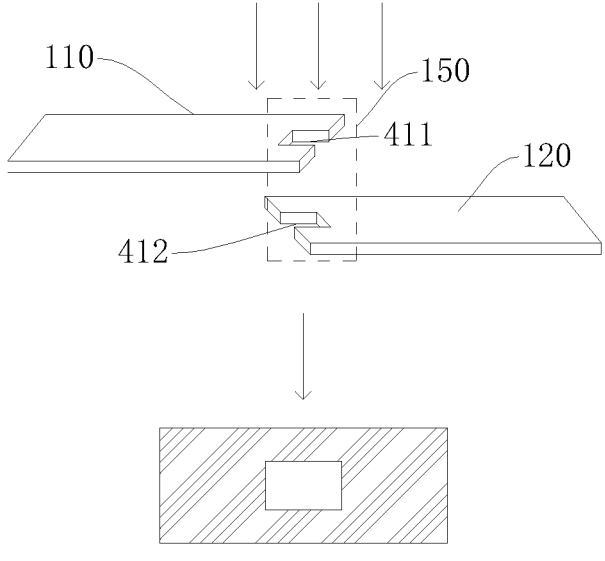
FIG. 19 shows schematic views illustrating orthographic projections of a first electrode layer and a second electrode layer in FIG. 17 projected onto a first dielectric layer.

Referring to FIG. 19, in an embodiment, one end of the first electrode layer 110 proximate to the second electrode layer 120 has a first opening 411. One end of the second electrode layer 120 proximate to the first electrode layer 110 has a second opening 412. Orthographic projections of the first opening 411 and the second opening 412 respectively projected onto the first dielectric layer 100 coincide. The first opening 411 and the second opening 412 may be of the same size.

When the third magnetic field enhancing component 40 is placed in the excitation field of the MRI system, portions of the first electrode layer 110 and second electrode layer 120, which correspond to the overlapped portion of the orthographic projections of the first electrode layer 110 and the second electrode layer 120 projected onto the first dielectric layer 100, may form the first structural capacitor 150. The first opening 411 and the second opening 412 can change the distribution of the electric field in the first structural capacitor 150. The first opening 411 and the second opening 412 can optimize a local magnetic field distribution, thereby improving the detection effect for a specific position in the body part to be detected.

Figure 20:
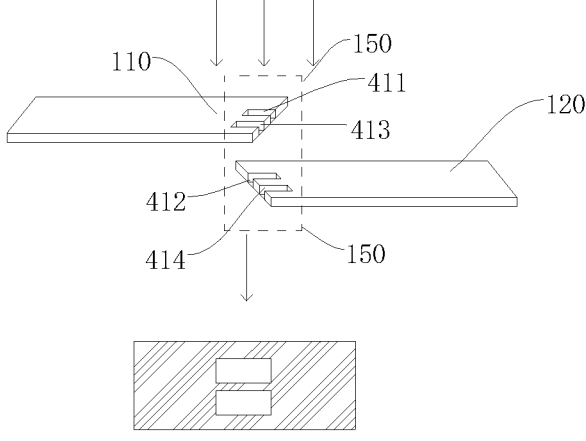
FIG. 20 shows schematic views illustrating shapes of the orthographic projections of the first electrode layer and the second electrode layer in FIG. 17 projected onto the first dielectric layer.

Referring to FIG. 20, in an embodiment, one end of the first electrode layer 110 proximate to the second electrode layer 120 has a third opening 413. The third opening 413 and the first opening 411 are arranged at an interval. One end of the second electrode layer 120 proximate to the first electrode layer 110 has a fourth opening 414. The fourth opening 414 and the second opening 412 are arranged at intervals. An orthographic projection of the third opening 413 and an orthographic projection of the fourth opening 414, which are projected onto the first dielectric layer 100, coincide. It may be understood that the first opening 411 and the third opening 413 may have the same shape and the same size. The second opening 412 and the fourth opening 414 may have the same size and the same shape. A distance between the first opening 411 and the third opening 413 may be the same. A distance between the second opening 412 and the fourth opening 414 may be the same. The third opening 413 and the fourth opening 414 may be located at a portion of the first electrode layer 110 and a portion of the second electrode layer 120 respectively, which correspond to the overlapped portion of the orthographic projections of the first electrode layer 110 and the second electrode layer 120 projected onto the first dielectric layer 100. The third opening 413 and the fourth opening 414 further optimize the local magnetic field distribution, thereby improving the detection effect for a specific position in the body part to be detected.

It may be understood that the first magnetic field enhancing components 10 in FIGS. 8-9 and 11-12 may be replaced by the plurality of the third magnetic field enhancing components 40. When the third magnetic field enhancing components 40 are applied to the magnetic field enhancing device 20, the first annular conductive sheet 510 is connected to the one end, away from the third electrode layers 130, of the first electrode layer 110 of each of the plurality of third magnetic field enhancing components 40, and the second annular conductive sheet 520 is connected to the one end, away from the first electrode layer 110, of the third electrode layer 130 of each of the plurality of third magnetic field enhancing components 40.

The technical features of the embodiments above may be combined arbitrarily. For the purpose of concision, not all possible combinations of the technical features of the embodiments above are described. However, as long as there are no contradictions between the combinations of these technical features, all combinations should be within the scope of the description of this specification.

The embodiments described above only illustrate several implementations of the present application, and the description of which is more specific and detailed, but cannot therefore be understood to limit the scope of the present application. It should be noted that, for those skilled in the art, various modifications and improvements may be made without departing from the concept of the present application, and these modifications and improvements all fall within the protection scope of the present application. Therefore, the protection scope of the present application shall be subject to the appended claims.

Finally, it should also be noted that in the present disclosure, relational terms such as "first" and "second", etc., are only used to distinguish one entity or one operation from another, but do not necessarily require or imply that there is such an actual relationship or an order between these entities or operations. Furthermore, the term "comprise", "include", or any other variation thereof, are intended to cover a non-exclusive inclusion, such that a process, a method, an article, or an apparatus, which includes a serials of elements, includes not only these elements, but also elements not expressly listed, or other elements inherent in the process, method, article, and apparatus. Without further limitations, an element defined by the phrase "including a . . . " does not exclude the presence of additional identical elements in the process, method, article or apparatus including the element.

Each embodiment in the specification is described in a progressive manner, each embodiment focuses on its difference from other embodiments, and the same and similar part of the embodiments may be referred to each other.

The above description of the disclosed embodiments is disclosed to enable those skilled in the art to make or use the present application. Various modifications to these embodiments will be obvious for those skilled in the art, and the general principles defined herein may be implemented in other embodiments without departing from the spirit or scope of the application. Therefore, the present application should not be limited to the embodiments in the disclosure, but should be in accordance with the widest scope consistent with the principles and novel features in the present disclosure.

What is claimed is:

1. A magnetic field enhancing component applicable to a magnetic resonance imaging (MRI) system, characterized by comprising:
   a first dielectric layer comprising a first surface and a second surface opposite to each other;
   a first electrode layer and a second electrode layer arranged on the first surface at an interval;
   a third electrode layer and a fourth electrode layer arranged on the second surface at an interval, wherein an orthographic projection of the first electrode layer projected onto the first dielectric layer overlaps with an orthographic projection of the third electrode layer projected onto the first dielectric layer; the first electrode layer, the first dielectric layer, and the third electrode layer form a second structural capacitor; an orthographic projection of the second electrode layer projected onto the first dielectric layer overlaps with an orthographic projection of the fourth electrode layer projected onto the first dielectric layer; and the second electrode layer, the first dielectric layer, and the fourth electrode layer form a third structural capacitor; and
   a control circuit, comprising:
      a third capacitor, one terminal of the third capacitor being connected to the first electrode layer, and another terminal of the third capacitor being connected to the second electrode layer;
      a first inductor, one terminal of the first inductor being connected to the second electrode layer; and
      a first switch circuit connected between another terminal of the first inductor and the first electrode layer, wherein the first switch circuit is configured to be turned off in a radio frequency (RF) receiving period of the MRI system, the first switch circuit is further configured to be turned on in an RF transmitting period of the MRI system.

2. The magnetic field enhancing component according to claim 1, wherein the first switch circuit comprises:
   a first diode, a positive terminal of the first diode being connected to the first electrode layer, and a negative terminal of the first diode being connected to the other terminal of the first inductor; and
   a second diode, a positive terminal of the second diode being connected to the other terminal of the first inductor, and a negative terminal of the second diode is connected to the first electrode layer.

3. The magnetic field enhancing component according to claim 1, wherein the first switch circuit comprises:
   a first enhancement-mode MOSFET, a drain and a grid of the first enhancement-mode MOSFET being connected to the one terminal of the first inductor away from the second electrode layer, and a source of the first enhancement-mode MOSFET being connected to the first electrode layer; and
   a second enhancement-mode MOSFET, a drain and a grid of the second enhancement-mode MOSFET being connected to the first electrode layer, and a source of the second enhancement-mode MOSFET being connected to the one terminal of the first inductor away from the second electrode layer.

4. The magnetic field enhancing component according to claim 1, wherein, the first electrode layer further comprises a first sub-electrode layer and a first connecting layer, and the first sub-electrode layer is connected to the first connecting layer;
   the first connecting layer is disposed proximate to the second electrode layer;
   an orthographic projection of the first sub-electrode layer projected onto the first dielectric layer overlaps with an orthographic projection of the third electrode layer projected onto the first dielectric layer;
   the one terminal of the third capacitor is connected to one end of the first connecting layer proximate to the first sub-electrode layer, and the other terminal of the third capacitor is connected to the second electrode layer;
   the first switch circuit is connected between another end of the first connecting layer away from the first sub-electrode layer and the second electrode layer; and the first connecting layer forms the first inductor.

5. The magnetic field enhancing component according to claim 1, wherein, the control circuit further comprises a fourth capacitor connected between the third capacitor and the first electrode layer.

6. The magnetic field enhancing component according to claim 5, wherein a capacitance value of the second structural capacitor, a capacitance value of the third structural capacitor, a capacitance value of the third capacitor, and a capacitance value of the fourth capacitor are equal.

7. The magnetic field enhancing component according to claim 5, further comprising a fifth electrode layer, wherein:

the fifth electrode layer is arranged on the second surface and arranged between the third electrode layer and the fourth electrode layer; the fifth electrode layer, the third electrode layer and the fourth electrode layer are arranged at intervals;

an orthographic projection of the fifth electrode layer projected onto the first dielectric layer overlaps with the orthographic projection of the first electrode layer projected onto the first dielectric layer; the fifth electrode layer, the first dielectric layer, and the first electrode layer form the fourth capacitor;

the orthographic projection of the fifth electrode layer projected onto the first dielectric layer overlaps with the orthographic projection of the second electrode layer projected onto the first dielectric layer; and the fifth electrode layer, the first dielectric layer, and the second electrode layer form the third capacitor.

8. The magnetic field enhancing component according to claim 1, wherein:

the control circuit further includes a third inductor;

the first inductor, the first switch circuit, and the third inductor are connected in sequence in series; and one terminal of the third inductor is connected to the first electrode layer, and another terminal of the third inductor is connected to the first switch circuit.

9. A magnetic field enhancing device applicable to an MRI system, characterized by comprising:

a cylindrical supporting structure having two opposite and spaced ends comprising a third end and a fourth end;

a plurality of magnetic field enhancing components of claim 1 arranged on the cylindrical supporting structure at intervals, each of the plurality of magnetic field enhancing components being configured to extend from the third end to the fourth end;

a first annular conductive sheet arranged on the cylindrical supporting structure and proximate to the third end, and electrically connected to third electrode layers of the plurality of magnetic field enhancing components; and a second annular conductive sheet arranged on the cylindrical supporting structure and proximate to the fourth end, and electrically connected to fourth electrode layers of the plurality of magnetic field enhancing components.

10. The magnetic field enhancing device according to claim 9, wherein, the first annular conductive sheet comprises a control connecting opening; the control connecting opening comprises a first connecting terminal and a second connecting terminal; the first connecting terminal and the second connecting terminal are connected to third electrode layers of two adjacent magnetic field enhancing components, respectively; and the control circuit is connected between the first connecting terminal and the second connecting terminal.

11. The magnetic field enhancing device according to claim 9, wherein the first switch circuit comprises:

a first diode, a positive terminal of the first diode being connected to the first electrode layer, and a negative terminal of the first diode being connected to the other terminal of the first inductor; and a second diode, a positive terminal of the second diode being connected to the other terminal of the first inductor, and a negative terminal of the second diode is connected to the first electrode layer.

12. The magnetic field enhancing device according to claim 9, wherein the first switch circuit comprises:

a first enhancement-mode MOSFET, a drain and a grid of the first enhancement-mode MOSFET being connected to the one terminal of the first inductor away from the second electrode layer, and a source of the first enhancement-mode MOSFET being connected to the first electrode layer; and a second enhancement-mode MOSFET, a drain and a grid of the second enhancement-mode MOSFET being connected to the first electrode layer, and a source of the second enhancement-mode MOSFET being connected to the one terminal of the first inductor away from the second electrode layer.

13. The magnetic field enhancing device according to claim 9, wherein, the first electrode layer further comprises a first sub-electrode layer and a first connecting layer, and the first sub-electrode layer is connected to the first connecting layer;

the first connecting layer is disposed proximate to the second electrode layer;

an orthographic projection of the first sub-electrode layer projected onto the first dielectric layer overlaps with an orthographic projection of the third electrode layer projected onto the first dielectric layer;

the one terminal of the third capacitor is connected to one end of the first connecting layer proximate to the first sub-electrode layer, and the other terminal of the third capacitor is connected to the second electrode layer;

the first switch circuit is connected between another end of the first connecting layer away from the first sub-electrode layer and the second electrode layer; and the first connecting layer forms the first inductor.

14. The magnetic field enhancing device according to claim 9, wherein, the control circuit further comprises a fourth capacitor connected between the third capacitor and the first electrode layer.

15. The magnetic field enhancing device according to claim 14, further comprising a fifth electrode layer, wherein:

the fifth electrode layer is arranged on the second surface and arranged between the third electrode layer and the fourth electrode layer; the fifth electrode layer, the third electrode layer and the fourth electrode layer are arranged at intervals;

an orthographic projection of the fifth electrode layer projected onto the first dielectric layer overlaps with the orthographic projection of the first electrode layer projected onto the first dielectric layer; the fifth electrode layer, the first dielectric layer, and the first electrode layer form the fourth capacitor;

the orthographic projection of the fifth electrode layer projected onto the first dielectric layer overlaps with the orthographic projection of the second electrode layer projected onto the first dielectric layer; and the fifth electrode layer, the first dielectric layer, and the second electrode layer form the third capacitor.

16. The magnetic field enhancing device according to claim 9, wherein:

the control circuit further includes a third inductor;

the first inductor, the first switch circuit, and the third inductor are connected in sequence in series; and one terminal of the third inductor is connected to the first electrode layer, and another terminal of the third inductor is connected to the first switch circuit.

17. A magnetic field enhancing device applicable to an MRI system, characterized by comprising:

a cylindrical supporting structure having two opposite and spaced ends comprising a third end and a fourth end;

a plurality of magnetic field enhancing components arranged on the cylindrical supporting structure at intervals, each of the plurality of magnetic field enhancing components being configured to extend from the third end to the fourth end, and each of the plurality of magnetic field enhancing components comprising:

a first dielectric layer comprising a first surface and a second surface opposite to each other;

a first electrode layer arranged on the first surface; and a second electrode layer and a third electrode layer arranged on the second surface at an interval, wherein an orthographic projection of the first electrode layer projected onto the first dielectric layer overlaps with an orthographic projection of the second electrode layer projected onto the first dielectric layer; the first electrode layer, the first dielectric layer, and the second electrode layer form a second structural capacitor; the orthographic projection of the first electrode layer projected onto the first dielectric layer overlaps with an orthographic projection of the third electrode layer projected onto the first dielectric layer; and the first electrode layer, the first dielectric layer, and the third electrode layer form a third structural capacitor;

a first annular conductive sheet arranged on the cylindrical supporting structure and proximate to the third end, and electrically connected to second electrode layers of the plurality of magnetic field enhancing components; and a second annular conductive sheet arranged on the cylindrical supporting structure and proximate to the fourth end, and electrically connected to third electrode layers of the plurality of magnetic field enhancing components;

wherein the first annular conductive sheet comprises a control connecting opening; the control connecting opening is an opening of the first annular conductive sheet; the control connecting opening comprises a first connecting terminal and a second connecting terminal;

each of the plurality of magnetic field enhancing components comprising a control circuit, comprising:

a third capacitor, one terminal of the third capacitor being connected to the first connecting terminal, and another terminal of the third capacitor being connected to the second connecting terminal;

a first inductor, one terminal of the first inductor being connected to the first connecting terminal; and a first switch circuit connected between another terminal of the first inductor and the second connecting terminal, wherein the first switch circuit is configured to be turned off in a radio frequency (RF) receiving period of the MRI system, the first switch circuit is further configured to be turned on in an RF transmitting period of the MRI system, so that the control circuit is in a high impedance state.

18. A magnetic field enhancing device applicable to a magnetic resonance imaging (MRI) system, characterized by comprising:

a cylindrical supporting structure having two opposite and spaced ends comprising a third end and a fourth end;

a plurality of magnetic field enhancing components arranged on the cylindrical supporting structure at intervals, each of the plurality of magnetic field enhancing components being configured to extend from the third end to the fourth end, and each of the plurality of magnetic field enhancing components comprising:

a first dielectric layer comprising a first surface and a second surface opposite to each other, and a through hole being formed in the first dielectric layer;

a first electrode layer and a third electrode layer arranged on the first surface at an interval;

a second electrode layer arranged on the second surface and electrically connected to the first electrode layer through conductive material filled in the through hole; an orthographic projection of the first electrode layer projected onto the first dielectric layer overlaps with an orthographic projection of the second electrode layer projected onto the first dielectric layer; the first electrode layer, the first dielectric layer, and the second electrode layer form a first structural capacitor;

a first annular conductive sheet arranged on the cylindrical supporting structure and proximate to the third end, and electrically connected to one end, away from the third electrode layers, of the first electrode layers of each of the plurality of magnetic field enhancing components; and a second annular conductive sheet arranged on the cylindrical supporting structure and proximate to the fourth end, and electrically connected to one end, away from the first electrode layer, of the third electrode layer of each of the plurality of magnetic field enhancing components.

19. The magnetic field enhancing device according to claim 18, wherein:

one end of the first electrode layer proximate to the second electrode layer has a first opening;

one end of the second electrode layer proximate to the first electrode layer has a second opening; and orthographic projections of the first opening and the second opening respectively projected onto the first dielectric layer coincide.

\* \* \* \* \*